(12) United States Patent
Schäuble et al.

(10) Patent No.: US 11,134,565 B2
(45) Date of Patent: Sep. 28, 2021

(54) PRINTED CIRCUIT BOARD AND METHOD FOR PRODUCING THE PRINTED CIRCUIT BOARD

(71) Applicant: Endress+Hauser SE+Co. KG, Maulburg (DE)

(72) Inventors: Harald Schäuble, Lörrach (DE); Alexander Scheffs, Hausen i.W. (DE); Christian Mutter, Huttingen (DE)

(73) Assignee: Endress+Hauser SE+Co. KG, Maulburg (DE)

( * ) Notice: Subject to any disclaimer, the term of this patent is extended or adjusted under 35 U.S.C. 154(b) by 56 days.

(21) Appl. No.: 16/463,726

(22) PCT Filed: Oct. 11, 2017

(86) PCT No.: PCT/EP2017/075922
§ 371 (c)(1),
(2) Date: May 23, 2019

(87) PCT Pub. No.: WO2018/095647
PCT Pub. Date: May 31, 2018

(65) Prior Publication Data
US 2019/0387618 A1    Dec. 19, 2019

(30) Foreign Application Priority Data
Nov. 23, 2016    (DE) .................... 10 2016 122 577.0

(51) Int. Cl.
*H05K 1/02*     (2006.01)
*H05K 3/00*     (2006.01)
(Continued)

(52) U.S. Cl.
CPC ........ *H05K 1/0278* (2013.01); *H01M 50/213* (2021.01); *H05K 3/0044* (2013.01);
(Continued)

(58) Field of Classification Search
CPC ........ H05K 3/301; H05K 3/325; H05K 3/326; H05K 1/147; H05K 5/0026; H05K 1/0281; H05K 2201/042; H05K 2201/046
See application file for complete search history.

(56) References Cited

U.S. PATENT DOCUMENTS

| | | | |
|---|---|---|---|
| 3,181,974 A | 5/1965 | La Barbera | |
| 4,082,984 A * | 4/1978 | Iwata | H01F 30/10 315/241 P |

(Continued)

FOREIGN PATENT DOCUMENTS

| | | |
|---|---|---|
| CN | 1669355 A | 9/2005 |
| CN | 201479468 U | 5/2010 |

(Continued)

OTHER PUBLICATIONS

Search Report for German Patent Application No. 10 2016 122 577.0, German Patent Office, dated Aug. 21, 2017, 4 pp.

(Continued)

*Primary Examiner* — Rockshana D Chowdhury
*Assistant Examiner* — Douglas R Burtner
(74) *Attorney, Agent, or Firm* — Mark A. Logan; Endress+Hauser (USA) Holding Inc.

(57) ABSTRACT

Disclosed is a printed circuit board having a holder for a battery, wherein the holder includes first and second contacts connected to conductive traces of the printed circuit board and wherein the holder is embodied such that a battery inserted into the holder is clamped so that poles of the battery on opposite end faces of the battery make electrical contact with the first and second contacts. The battery lies clamped between the contacts on a support region of the printed circuit board and is oriented with reference to the printed circuit board so that an imaginary line connecting the poles of the battery is essentially in parallel with the plane of the support region. The printed circuit board has con- (Continued)

nected with the support region a rigid first section, which is essentially perpendicular to the support region, and wherein the first contact is arranged on the first section.

9 Claims, 4 Drawing Sheets (51) Int. Cl.
*H05K 5/00* (2006.01)
*H01M 50/213* (2021.01)
*H05K 3/30* (2006.01)
*H05K 3/32* (2006.01)

(52) U.S. Cl.
CPC ............. *H05K 3/301* (2013.01); *H05K 3/325* (2013.01); *H05K 3/326* (2013.01); *H05K 5/0026* (2013.01); *H01M 2220/30* (2013.01); *H05K 2201/0909* (2013.01); *H05K 2201/09036* (2013.01); *H05K 2201/09063* (2013.01); *H05K 2201/09227* (2013.01); *H05K 2201/10037* (2013.01); *H05K 2201/10265* (2013.01); *H05K 2201/10393* (2013.01); *H05K 2201/10606* (2013.01); *H05K 2203/0228* (2013.01); *H05K 2203/302* (2013.01); *Y02E 60/10* (2013.01)

(56) References Cited

U.S. PATENT DOCUMENTS

| | | | | |
|---|---|---|---|---|
| 4,085,433 A * | 4/1978 | Baranowski | ........... | H05K 1/189 361/744 |
| 4,904,192 A | 2/1990 | Holden et al. | | |
| 4,911,643 A * | 3/1990 | Perry | ........ | H01R 4/01 439/493 |
| 4,977,042 A * | 12/1990 | Chiyajo | ........ | B26B 19/286 429/49 |
| 5,220,488 A * | 6/1993 | Denes | ........ | B29C 70/78 174/254 |
| 5,250,371 A * | 10/1993 | Kleinert, III | ........ | H05K 3/325 429/99 |
| 5,607,795 A * | 3/1997 | Saida | ........ | H01M 50/213 429/100 |
| 5,617,066 A * | 4/1997 | Dittmann | ........ | H01H 51/2281 335/78 |
| 5,863,674 A * | 1/1999 | Yamanaka | ........ | H01M 50/50 429/100 |
| 5,903,440 A * | 5/1999 | Blazier | ........ | H05K 3/0014 361/749 |
| 6,141,223 A * | 10/2000 | Fukushima | ........ | H05K 3/301 361/781 |
| 6,293,819 B1 * | 9/2001 | Wu | ........ | H01R 4/489 429/100 |
| 6,530,804 B1 | 3/2003 | Wu | | |
| 6,579,119 B1 * | 6/2003 | Wu | ........ | H01R 11/282 429/100 |
| 8,342,717 B1 * | 1/2013 | Livesay | ........ | H05K 1/141 362/310 |
| 2003/0186119 A1 * | 10/2003 | Miller | ........ | H01M 50/572 429/176 |
| 2004/0008982 A1 * | 1/2004 | Matsuo | ........ | H05K 1/116 396/89 |
| 2005/0117763 A1 * | 6/2005 | Svendsen | ........ | H05K 1/0284 381/315 |
| 2006/0263677 A1 * | 11/2006 | Tsai | ........ | H01M 50/216 429/97 |
| 2007/0229656 A1 * | 10/2007 | Khait | ........ | H01M 50/213 348/77 |
| 2008/0093110 A1 * | 4/2008 | Bagung | ........ | H05K 1/189 174/254 |
| 2010/0129687 A1 | 5/2010 | Kim | | |
| 2011/0284275 A1 * | 11/2011 | Bagung | ........ | H05K 1/0278 174/257 |
| 2012/0026699 A1 * | 2/2012 | Hsu | ........ | H05K 3/0052 361/749 |
| 2014/0133084 A1 * | 5/2014 | Lin | ........ | G06F 1/185 361/679.32 |
| 2015/0085903 A1 * | 3/2015 | Gundel | ........ | H05K 1/18 375/219 |
| 2017/0104906 A1 * | 4/2017 | Tang | ........ | H05K 1/142 |
| 2017/0171969 A1 * | 6/2017 | Tanabe | ........ | G11B 5/4853 |
| 2018/0235082 A1 * | 8/2018 | Salter | ........ | H05K 1/0278 |
| 2019/0355505 A1 * | 11/2019 | Park | ........ | H01F 27/2804 |
| 2020/0288596 A1 * | 9/2020 | Weber | ........ | H05K 7/1427 |
| 2020/0321839 A1 * | 10/2020 | Tateyama | ........ | H05K 1/028 |

FOREIGN PATENT DOCUMENTS

| | | |
|---|---|---|
| DE | 8503703 U1 | 5/1985 |
| DE | 69406604 T2 | 3/1998 |
| EP | 0191291 A1 | 8/1986 |
| EP | 1532842 A1 | 5/2005 |
| EP | 2592913 A1 | 5/2013 |
| JP | 05220277 | 8/1993 |
| WO | 2016096131 A1 | 6/2016 |

OTHER PUBLICATIONS

International Search Report for Patent Application No. PCT/EP2017/075922, WIPO, dated Jan. 10, 2018, 17 pp.

* cited by examiner

PRINTED CIRCUIT BOARD AND METHOD FOR PRODUCING THE PRINTED CIRCUIT BOARD

CROSS-REFERENCE TO RELATED APPLICATIONS

The present application is related to and claims the priority benefit of German Patent Application No. 10 2016 122 577.0, filed on Nov. 23, 2016 and International Patent Application No. PCT/EP2017/075922, filed on Oct. 11, 2017, the entire contents of which are incorporated herein by reference.

TECHNICAL FIELD

The invention relates to a printed circuit board having a holder for a battery, to a housing with such a printed circuit board arranged therein, as well as to a method for manufacturing a printed circuit board of the invention.

BACKGROUND

In automation technology, field devices are applied for determining and/or monitoring process variables, especially physical or chemical, process variables. A field device typically includes a sensor unit coming, at least partially and at least at times, in contact with the process. Referred to as field devices in the case of the present invention are, in principle, all measuring devices, which are applied near to the process and which deliver, or process, process relevant information. These include, for example, fill-level measuring devices, flow measuring devices, pressure- and temperature measuring devices, pH-redox potential measuring devices, conductivity measuring devices, etc., which register the corresponding process variables, fill level, flow, pressure, temperature, pH value, and conductivity. Such field devices are manufactured and sold in various embodiments by the E+H group of companies.

Many field devices of automation technology are, in the present state of the art, increasingly no longer connected by means of a cable or wire to a superordinated unit, but, instead, communicate with such exclusively per radio, such as, for example, WLAN, Bluetooth, or near field communication. In such case, the field device can also be part of a wireless communication network, such as, for example, a Bluetooth, ZigBee, WLAN, GSM, LTE, or UMTS—communication network or, however, also a wireless version of a fieldbus, especially such based on 802.15.4 standards, such as wireless HART. By means of such communication networks operating other than by cable, then also without a cable- or wired contacting of the field device, measurement data and/or other information (for example, information for parametering, for servicing and/or for diagnosis) can be transmitted to or from the superordinated unit and/or to or from a mobile end device, such as a smart phone, a tablet or a mobile end device specific for process automation, such as the FieldXpert of Endress+Hauser.

This has the great advantage that, in principle, cable- or wire no longer has to be run to the process-near field device. However, usually also the supplying of the field device with the electrical energy required by it occurs via a cable- or wire. For example, the field device is connected to an external energy supply unit via a two- or four wire line. Therefore, upon eliminating the cable- or wire, the energy supply of the field device must occur by means of an internal energy supply unit, such as, for example, a battery.

For supplying a field device of automation technology with electrical energy, typically a battery is required, which provides a sufficiently constant voltage of at least 1.2 V. Such a battery is embodied in the state of the art as a round battery, i.e. a battery with a round shape, wherein a round battery can, for example, also be formed by the connecting of a plurality of button cells.

In such case, there comes the task of integrating the battery as simply and space savingly as possible in the field device of automation technology. Thus, it is advantageous to arrange a holder for a battery in the vicinity of a printed circuit board of the field device, where electronic components of the field device are arranged. Especially advantageous is an integration of the holder for a battery in the printed circuit board.

Known from the state of the art are printed circuit boards, which have a holder for a battery. Thus, for example, US 2010 129 687 A discloses a printed circuit board designed for seating a button cell. A printed circuit board having a holder for a round battery for a field device is disclosed in Chinese utility model CN 2014 79468 U. In such case, the printed circuit board has an opening, into which a portion of the battery protrudes, whereby a space saving arrangement of the battery in the holder is enabled. A band goes around the battery to provide sufficient securement. The securement of the known holder is resistant to vibrations, which can occur in a process installation of automation technology. However, the solution proposed in CN 2014 79468 U enables no easy insertion and/or replacement of the battery.

Also known is a printed circuit board having a holder for a battery with two contact elements soldered on the printed circuit board, wherein the battery inserted into the holder is clamped between the contact elements in such a manner that an imaginary line connecting the poles of the battery is essentially parallel with a plane of the printed circuit board. The two contact elements serve for establishing electrical contact and for clamping the battery, and are for this at least sectionally elastically deformable. The elastically deformable section of the contact element is, in such case, arranged essentially perpendicularly to the plane of the printed circuit board, wherein the contact element is soldered to a contact area of the printed circuit board by means of a section arranged perpendicularly to the elastically deformable section.

In order to make such a holder vibration resistant, relatively large clamping forces are required. Also, in the case of such a solution, exactly in the case of high clamping forces, the insertion and/or replacement of the battery become(s) difficult. Additionally, the contact elements of the battery transmit clamping forces essentially at right angles to the printed circuit board. Therefore, the clamping forces act at an unfavorable angle to the solder joint of the soldered on contact elements, namely, in each case, not as a normal force acting perpendicularly on the solder joint, but, instead, also in a direction parallel thereto, i.e. as a shear force. Because of the shear force, the solder joint of the contact element can be weakened.

SUMMARY

An object of the invention, therefore, is to provide a printed circuit board having a holder for a battery, especially a round battery, which is space saving and simultaneously enables easy insertion and/or replacement of the battery. Additional objects of the invention include a housing, especially for a field device of automation technology, with a printed circuit board of the invention arranged therein, and a method for manufacturing the holder-equipped, printed circuit board of the invention.

Regarding the printed circuit board, the object is achieved by the features defined in claim 1, wherein the printed circuit board has a holder for a battery, wherein the holder includes first and second contacts connected to conductive traces of the printed circuit board and wherein the holder is embodied in such a manner that a battery insertable into the holder is clamped in the installed state in such a manner between the two contacts that poles of the battery arranged on mutually opposite end faces of the battery make electrically conductive contact with different ones of the two contacts and the battery clamped between the contacts lies on a support region of the printed circuit board supporting the battery and is oriented with reference to the printed circuit board in such a manner that an imaginary line connecting the poles is arranged essentially in parallel with the plane of the support region of the printed circuit board, wherein the printed circuit board has connected with the support region a rigid first section, which is arranged essentially perpendicularly to the support region, and wherein the first contact is arranged on the first section.

According to the invention, the printed circuit board includes, thus, a support region and a first section connected therewith and arranged perpendicularly thereto, wherein the first contact is arranged on the first section.

Advantages of the invention include the following:

Since the holder is formed of the support region and the first section of the printed circuit board arranged perpendiculary thereto, the solution of the invention provides a printed circuit board, in which the holder is integrated space savingly. A further advantage of this solution provides that a first contact of such type is very simple to manufacture.

Because of the rigid first section of the printed circuit board, a favorable distribution of the clamping forces reigns in the first contact in the case of a battery installed in the holder. On the one hand, the clamping forces are distributed on the entire area of the first section. On the other hand, there results in the first contact an essentially perpendicular (i.e. pointing in the direction of the surface normal of the first section) transfer of the clamping forces to the first section, so that the clamping forces act on the first contact as a normal force.

The favorable distribution of the clamping forces in the first contact effects an easy insertion and/or replacement of a battery. Additionally, this leads to a higher resistance to vibrations.

In another development of the invention, the printed circuit board has a rigid second section connected with the support region. The second section is arranged essentially perpendicularly to the support region, wherein the second contact is arranged on the second section. In this further development, there are, thus, two sections arranged perpendicularly to the support region, namely the first and the second section. Each of the two contacts is, in such case, arranged on a different one of the two sections arranged perpendicularly to the support region. Thus, the first and the second sections are connected with different ends of the support region, wherein the two ends lie opposite one another. In this further development, the favorable distribution and direction of the clamping forces is present both for the first contact, as well as also for the second contact.

In another development of the invention, the first contact includes a contact area arranged on the first section. The contact area serves for electrical connection with one of the poles of a battery inserted into the holder in the installed state, in such a manner that in the installed state the pole is in direct electrical connection with the contact area. Advantageously in this further development, no further contact element is required for manufacture of the electrical connection with one of the poles of the battery, but, instead, the electrical connection of the first contact with the battery is made directly between the pole and the contact area, for example, in that a pole of the battery lies directly against the contact area.

The clamping of the battery in the installed state can occur by the feature that at least one of the contacts of the holder comprises at least one, at least sectionally resilient, contact element. In an embodiment, the first contact includes, consequently, a resilient first contact element or a first contact element having a resilient section, wherein the first contact element serves for clamping and electrical connection. Alternatively or supplementally, the second contact includes a resilient second contact element or a second contact element having a resilient section, wherein the second contact element serves for clamping and electrical connection.

In another development of the invention, the first contact element and/or the second contact element are/is embodied as SMD-solderable component(s). Each of the SMD-solderable components is soldered on a provided contact area of the printed circuit board, wherein the provided contact area is connected to the conductive trace going to the relevant contact. SMD stands for Surface Mounted Device. SMD-solderable components are emplaced with automatic populating machines on contact areas equipped with solder paste on the printed circuit board and soldered all at once in a single reflow-process. In a further development with the SMD-solderable contact elements, the soldering of the contact elements or of the contact element can be integrated with the reflow-process for the soldering of all additional SMD-solderable electronic components provided on the printed circuit board. This further development represents a manufacturing technologically especially preferred and thereby lastly also cost effective solution.

For the case, in which the contact is arranged on a section (namely the first or the second section) arranged perpendicularly to the support region and includes an SMD-contact element soldered on the solder contact area, a high strength, SMD-soldered solder joint is obtained due to the above mentioned, perpendicular force transfer to the solder joint. In this way, the failure safety of the solder joint of the contact of the holder for the battery is increased, and therewith also the failure safety of the energy supply of the field device.

In an embodiment of the invention, the second contact element is a contact clip arranged in the support region. The contact clip includes a foot soldered on the provided contact area and a resilient section serving for clamping and the electrical connection. The clamping forces in the second contact are, consequently, transferred to the printed circuit board essentially at a right angle to the printed circuit board. In this embodiment, the second contact comprises a preferably SMD-solderable contact clip known from the state of the art, manufactured to standard, and arranged on the support region, while, in contrast, the first contact of the invention is arranged on the second section arranged perpendicularly to the support region and is formed, for example, only by a contact area, against which a pole of a battery installed in the holder lies in the installed state. In this embodiment, consequently, the contact clip known from the state of the art is combined in especially easy manner with the solution of the invention.

In an additional embodiment of the invention, the first contact element is a spring contact arranged in the first section. Alternatively or supplementally, the second contact element is a spring contact arranged in the second section. The spring contact is, in such case, in each case, arranged in a section of the printed circuit board arranged perpendicularly to the support region, namely, in each case, in the first section and/or the second section. In this embodiment, the clamping forces act through the spring contact, consequently, essentially perpendicularly to the first and second sections, i.e. as normal forces. In the case of one or both of the spring contacts, such can be, for example, essentially cylindrical contact springs, or even U-shaped contact springs.

In an especially advantageous, further development of the invention, the support region includes an opening, into which the battery is insertable. The opening is especially dimensioned in such a manner that a portion of the battery installed from a first side of the support region into the opening and bearing on the opening protrudes out from the support region on a second side of the support region lying opposite the first side. In this advantageous, further development, the battery insertable into the holder lies in the installed state thus, in such a manner on the opening that the battery has a portion protruding through the opening. In this way, a portion of the battery is arranged on each side of the support region. Advantageously, this further development is an especially space saving arrangement of the battery. For the case, in which the printed circuit board is part of a field device of automation technology, this means that the size of the housing of the field device, and the field device, can, as a whole, be significantly reduced.

In an additional especially advantageous further development, at least one component is arranged on the second side of the support region. The opening, especially the dimensioning of the area of the opening, is such that the portion of a battery installed in the holder extending out from the printed circuit board has extending out from the support region a height, which is less than the height of that component soldered on the second side, which has the greatest structural height. In this especially advantageous, further development, the opening, especially the dimensioning of the area of the opening, is matched to the structural height of the largest component. The terminology, structural height, refers to the dimension of the component in the direction perpendicular to the support region. In this way, a battery inserted into the holder protrudes in the installed state only to the extent through the opening of the support region that the space present on the second side of the support region, which (because of the structural height of the largest component) is, in any event, present, is optimally utilized. In this way, an especially space saving arrangement of the battery in the holder is enabled.

In an embodiment, the support region is connected with the perpendicular first section via a flexible printed circuit board region of the printed circuit board. Printed circuit boards, which have a number of rigid printed circuit board regions, which are arrangeable relative to one another as much as desired by means of a flexible printed circuit board region, are a standardizable solution, which are known in the state of the art also as flex-rigid circuit boards. Alternatively, the support region and the first section arranged perpendiculary thereto are formed by two regions of a rigid printed circuit board bordering one another, between which is provided a trough shaped depression forming a fold line in the printed circuit board. The one time folding of a printed circuit board along a trough-shaped depression can occur, for example, in the case of a printed circuit board known from the state of the art, having a trough shaped depression between two planar, rigid printed circuit board regions. Such a printed circuit board is also referred to as a semi-flexible, or semi-flex, printed circuit board. For example, the printed circuit board manufacturer, Würth, sells such a printed circuit board under the mark WIRELAID, which has reinforcing copper structures, for example, for the conductive traces traversing the fold line. In this way, the one time folding of a printed circuit board required in the invention is possible without problem and without necessitating damaging of the conductive traces traversing the fold line.

In an embodiment, the support region is connected with the perpendicular second section via a flexible printed circuit board region of the printed circuit board. Alternatively, the support region and the perpendicular second section are formed by two regions of a rigid printed circuit board bordering one another, between which is provided a trough shaped depression in the printed circuit board forming a fold line.

In an embodiment, the printed circuit board includes for each provided section arranged perpendicularly to the support region, namely for the first section or for the first section and the second section, in each case, a locking means, especially locking means arranged on the printed circuit board. The locking means fixes its associated section in its orientation perpendicularly to the support region of the printed circuit board. For the locking means, there is, in principle, no limitation. It can be embodied, for example, as a locking (in given cases, by means of a joint means) brace mounted on the printed circuit board. Alternatively, for example, the locking means can also be formed by a cured potting compound, which is applied, for example, in an injection forming method on a predetermined region of the printed circuit board, or, however, also by an adhesive.

Regarding the housing, the object is achieved by a housing as defined in claim 13. The housing of claim 13, especially a housing of a field device of automation technology, has a printed circuit board of the invention arranged therein. The housing includes a housing region for each of the provided sections arranged perpendicularly to the support region, namely for the first section or for the first section and the second section. The printed circuit board is arranged in the housing in such a manner that the housing regions mechanically support their sections of the printed circuit board by means of seats and fix their orientations perpendicularly to the support region of the printed circuit board, wherein the sections protrude into the seats of their housing regions. In this embodiment, the fixing, or locking, of the section perpendicularly to the support region occurs by means of the housing region. In this way, in the case of the housing of the invention with the printed circuit board arranged therein, advantageously, no further means for the perpendicular locking of a section is necessary.

Regarding the method, the object is achieved by the features defined in claim 14. Claim 14 defines a method for manufacturing a printed circuit board of the invention having a holder for a battery. The support region and the one or more provided sections arranged perpendicularly to the support region, namely the first section or the first section and the second section, are produced from a rigid, planar, starting, printed circuit board containing the support region and the one or more sections by introducing, especially milling, in each case, along a fold line, a trough shaped depression into the starting, printed circuit board for each section. Each fold line represents a border between the support region and a section. Then, for each section, in each case, the particular section is brought, by folding the starting, printed circuit board along the fold line between the section and the support region, from the plane shared with the support region, into an arrangement perpendicular to the support region. In such case, the above mentioned, semi-flexible printed circuit board is a possible embodiment for the starting, printed circuit board. The starting, printed circuit board can, in given cases, be processed in additional process steps, in order to obtain a particular embodiment of the printed circuit board of the invention. For example, also the opening of the printed circuit board of the invention can be introduced, especially milled, into the printed circuit board. The method is manufacturing technologically especially easy and can be combined with these additional process steps for processing the starting, printed circuit board.

In an additional embodiment of the method, the trough shaped depression of a fold line has a round, rectangular or V-shaped cross section.

There is especially a first side of the starting, printed circuit board, on which the support region and the first section get closer to one another during the folding. On a second side of the starting, printed circuit board opposite this first side of the starting, printed circuit board, the support region and the first section get farther from one another during the folding. In principle, there is, in such case, within the scope of the invention, with reference to the first or second side, no limitation concerning on which side of the starting, printed circuit board the trough shaped depression of the fold line is arranged. The trough shaped depression of the fold line can be arranged either on the first side of the starting, printed circuit board, or on the second side of the starting, printed circuit board lying opposite the first side of the starting, printed circuit board.

BRIEF DESCRIPTION OF THE DRAWINGS

The invention as well as advantageous embodiments thereof will now be explained in greater detail based on examples of embodiments, which are shown in the figures. Equal parts are provided in all figures with equal reference characters; when perspicuity requires or it otherwise appears sensible, already presented reference characters are omitted in subsequent figures.

The figures of the drawing show as follows.

DETAILED DESCRIPTION

Figure 1A:
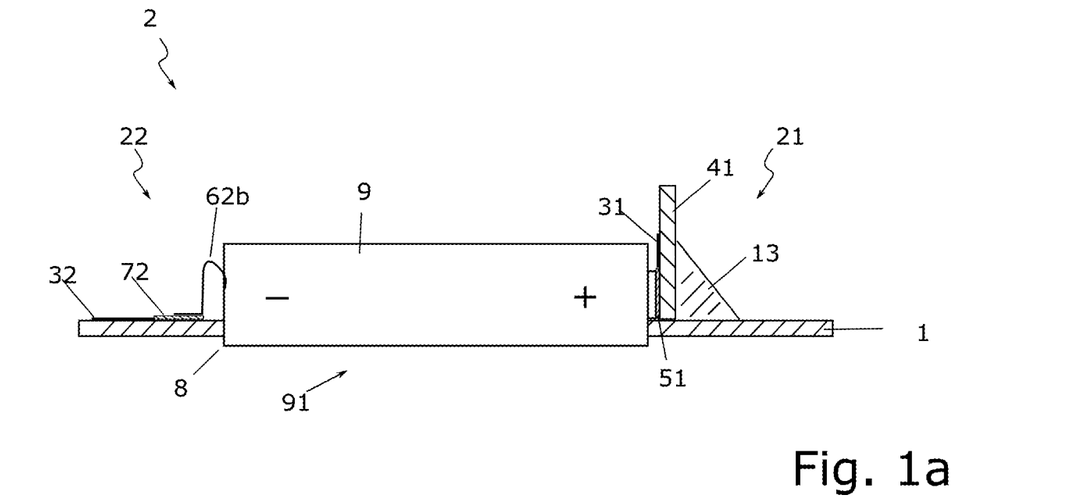
FIG. 1a shows a sectional view of an example of an embodiment of the printed circuit board of the present disclosure with a battery installed in the holder.
Figure 1B:
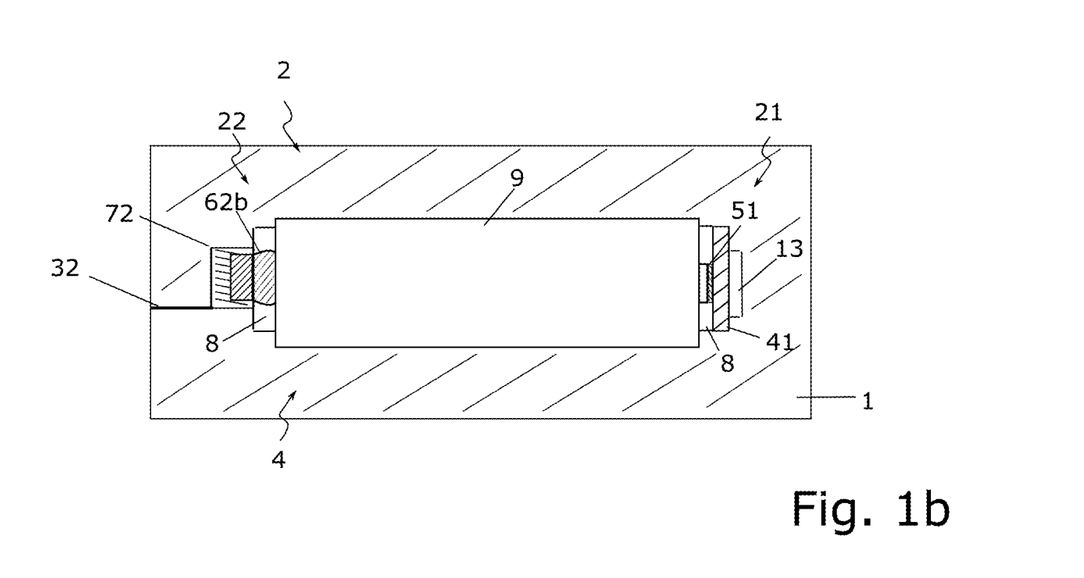
FIG. 1b shows a plan view of the example of an embodiment of FIG. 1a of the printed circuit board of the present disclosure with a battery installed in the holder.

Shown in FIGS. 1a, 1b is an example of an embodiment of the printed circuit board of the invention 1 with a battery 9 installed in the holder 2, wherein FIG. 1a represents a sectional view and FIG. 1b a plan view.

Holder 2 for battery 9 is formed by structural features including a support region 4, a first section 41 arranged perpendicularly thereto and the contacts 21, 22, wherein the battery 9 lies on the support region 4 in the installed state. First section 41 is, in such case, fixed in its essentially perpendicular orientation with reference to the support region 4 by a mechanical locking means 13, which is mounted on the printed circuit board 1. Alternatively, the locking means 13 can also be formed by a cured potting compound, which is applied, for example, in an injection forming method on a predetermined region of the printed circuit board 1, or, however, also by an adhesive.

The first contact 21 includes, in such case, a contact area 51, which lies directly against a first pole of the battery 9 installed in the holder 2 in the installed state. The contact area 51 is, in such case, connected to a conductive trace 31. In this way, an electrical connection of the first pole of the battery 9 with the printed circuit board 1 is established, wherein here only a section of the relevant region of the printed circuit board 1 is shown.

The second contact 22 includes a contact area 72 arranged on the support region 4 and a contact element 62 soldered to the contact area 72. The contact element is in this example of an embodiment an SMD-solderable and sectionally elastically deformable, contact clip 62b known per se from the state of the art and comprising a foot, which is soldered to the contact area 72, and a resilient section. Also, the contact area 72 is, in such case, connected to a conductive trace 32.

The resilient section of the contact clip 62b serves for establishing the electrical connection with a pole of the battery 9 as well as for the clamping of the battery 9 between the two contacts 21, 22 of the holder 2. In this way, electronic components EC, which are arranged and soldered on a first and/or second surface of the printed circuit board 1, can be supplied with energy from the battery 9 installed in the holder 2, wherein the insertion and/or the replacement of the battery 9 into the holder 2 of the invention is directly possible.

At the same time, the first section 41 of the printed circuit board assures in the first contact 21 an ideal distribution and forwarding of the clamping forces. In this embodiment of the invention, the resilient clamping is provided by the resilient section of the contact clip 62b. The contact clip 62b is, in such case, embodied as an SMD-solderable contact clip 62b, so that the arrangement of the contact clip 62b of the second contact 22 of the holder 2 is easy to incorporate into the shared reflow-soldering of all SMD-solderable components EC.

Furthermore, in this example of an embodiment, an opening 8 is introduced into the printed circuit board 1, wherein the opening 8 is arranged in the support region 4 of the printed circuit board 1. The opening 8 can in this example of an embodiment (as well as also in other embodiments of the invention), for example, be milled into the printed circuit board 1, or be created in the printed circuit board 1 by means of other working methods known from the state of the art. The dimensioning of the opening 8 is matched to the battery 9 provided for insertion into the holder 2 in such a manner that a portion 91 of the battery 9 protrudes through the opening 8; this is evident in the sectional view of FIG. 1a as well as also from the plan view of FIG. 1b. In this way, a space saving arrangement of the battery 9 is enabled, such being especially advantageous when the printed circuit board 1 is part of a field device of automation technology.

Figure 2A:
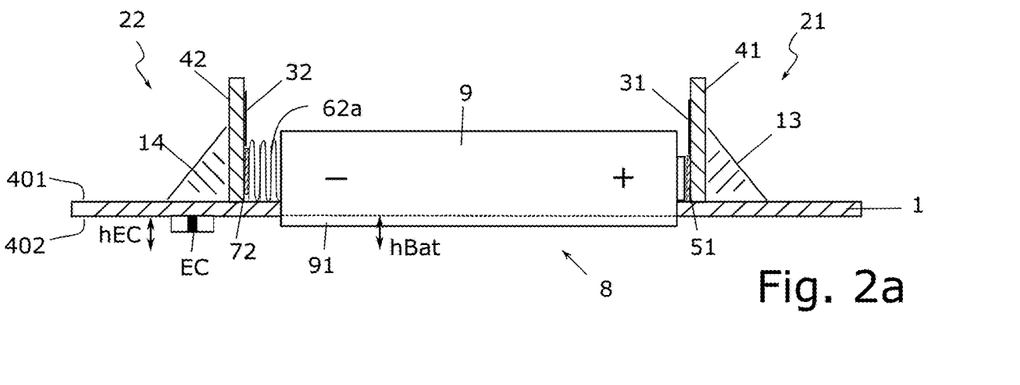
FIG. 2a shows a sectional view of an additional example of an embodiment of the printed circuit board of the present disclosure with a battery installed in the holder.
Figure 2B:
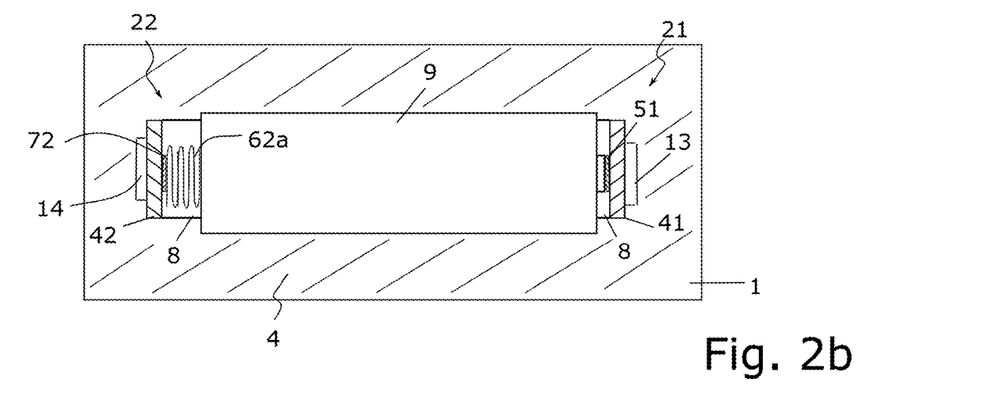
FIG. 2b shows a plan view of the additional example of an embodiment in FIG. 2a of the printed circuit board of the present disclosure with a battery installed in the holder.

FIGS. 2a and 2b show an embodiment of the printed circuit board 1 of the invention alternative to that shown in FIGS. 1a, b. FIG. 2a shows a sectional view, while FIG. 2b represents a plan view.

The first contact 21 of the example of an embodiment shown in FIGS. 2a, b is, in such case, embodied similarly to the example of an embodiment shown in FIGS. 1a, b, since it also has a first section 41 arranged perpendicularly to the support region 4, wherein here, additionally, the second contact 22 is now formed by, among other features, an additional section, namely the second section 42, arranged perpendicularly to the support region 4.

Second section 42 is, in such case, held in its perpendicular orientation relative to the support region 4 by a locking means 14, which can be applied and embodied in the same way as the locking means 13 of the first contact 21 mentioned in connection with FIGS. 1a, b. For clamping, the second contact 22 includes, in such case, an additional spring contact 62a, wherein the additional spring contact 62a is an essentially cylindrical contact spring, which is SMD-soldered on a contact area 72 arranged in the second section 42. Advantageously in such case, the clamping forces in this embodiment in each of the two contacts 21, 22 act only as normal forces on the contact areas 51, 72.

Also in the example of an embodiment shown in FIGS. 2a, b, the opening 8 shown in FIGS. 1a, b is provided in the support region 4 of the printed circuit board 1. In the example of an embodiment in FIGS. 2a, b, supplementally, a component EC with a structural height hEC in the direction perpendicular to the support region 4 is shown. In such case, the component EC is soldered on the second side 402 of the support region 4, wherein the battery 9 is insertable from the first side 401 of the support region 4 into the holder 2.

The battery protrudes with a height hBat from the opening 8 of the support region 4. In such case, the dimensioning of the opening 8 of the holder 2 is matched in such a manner to the components provided for soldering on the side 402 of the support region 4 as well as to the battery 9 that the protruding height hBat is less than or equal to the structural height hEC of that component EC soldered on the second side 402, or provided for soldering, which has the greatest structural height, i.e. the greatest structural height in comparison with all additional components soldered on the second side 402, or provided for soldering on the second side 402. The component EC, and/or the matching of the opening 8 to the structural height hEC and the battery 9, can, of course, also be added to the preceding example of an embodiment of FIGS. 1a, b.

In given cases, in the embodiment of the invention with the two sections 41, 42 arranged perpendicularly to the support region 4, the holder 2 can also have spring contacts 61a, 62a in both of the contacts, the first contact 21 and the second contact 22. This other example of an embodiment is shown in a sectional view in FIG. 2c. In the case of both spring contacts 61a, 62a, these are provided in this example of an embodiment in the form of spring contacts 61a, 62a SMD-soldered on the contact areas 71, 72, wherein the spring contacts 61a, 62a are embodied here essentially with U-shape. These can be soldered, for example, in a single reflow-process together with all SMD-solderable components, in each case, on a contact area 31 of the first contact 21, and on a contact area 32 of the second contact 22, of the printed circuit board 1. Of course, alternatively, in case the first contact 21 is embodied similarly as in the example of an embodiment shown in FIGS. 2a, 2b, then only the second contact 22 can have an essentially U-shaped spring contact 62a. In the first contact 21, then (see FIG. 2a) a pole of the battery 9 lies directly on a contact area 51.

Figure 3A:
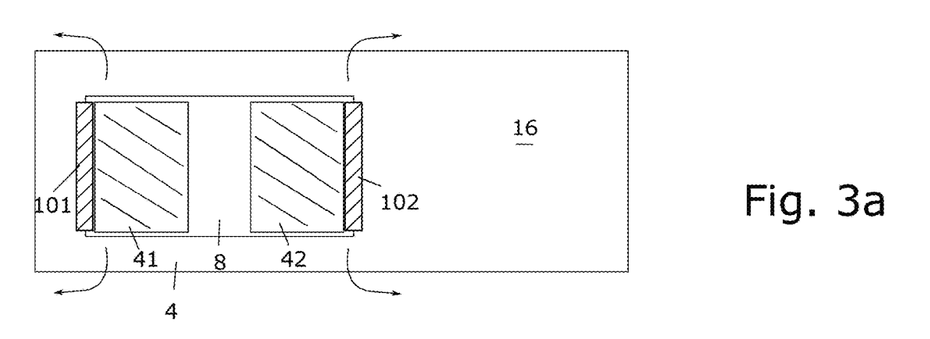
FIG. 3a shows a plan view of an example of an embodiment of the applied starting, printed circuit board in the case of the method for manufacturing the printed circuit board of the present disclosure.
Figure 3B:
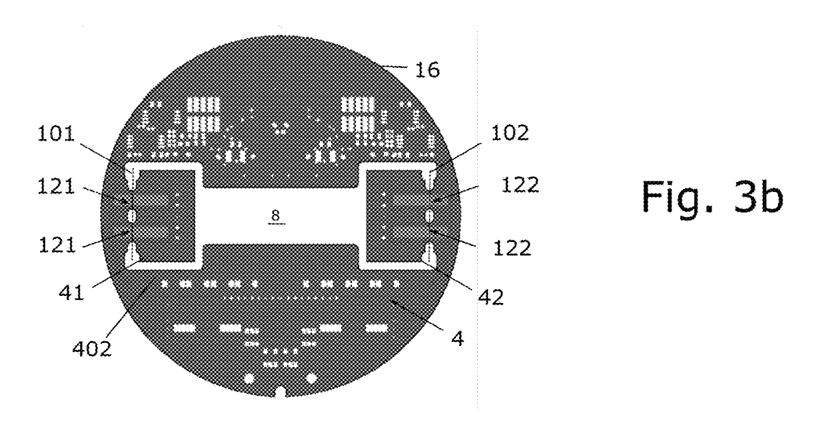
FIG. 3b shows a plan view of another example of an embodiment of the starting, printed circuit board used in the case of the method for manufacturing the printed circuit board of the present disclosure.
Figure 4A:
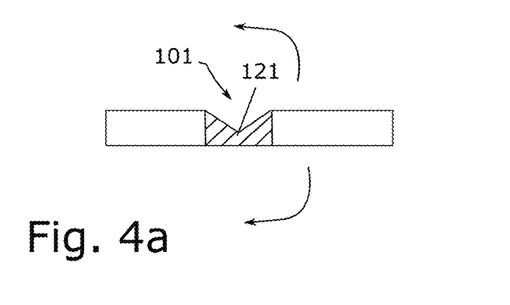
FIG. 4a shows a sectional view of an embodiment of the example of an embodiment of the starting, printed circuit board shown in FIG. 3b.
Figure 4B:
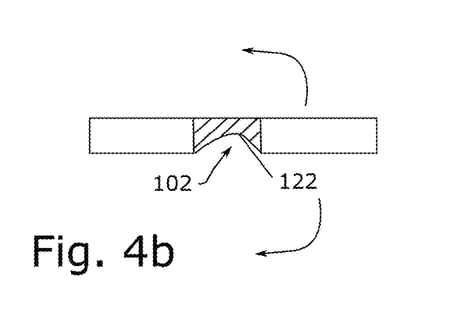
FIG. 4b shows a sectional view of an additional embodiment of the example of an embodiment of the starting, printed circuit board shown in FIG. 3b.
Figure 5:
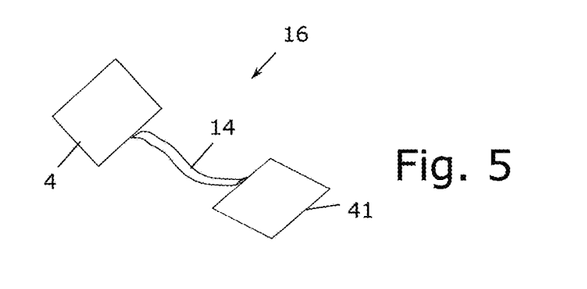
FIG. 5 shows another example of an embodiment of the method for manufacturing the printed circuit board of the present disclosure.

FIGS. 3-5 show examples of embodiments of a method, with which the printed circuit board 1 of the invention is manufacturable; especially examples of embodiments of a method for obtaining the first section 41 or alternatively the first section 41 and the second section 42, arranged perpendicularly to the support region 4 and connected with the support region 4.

Especially, FIG. 3a shows a plan view of a schematic representation of a starting, printed circuit board 16. Arranged In the rigid and planar, starting, printed circuit board 16 are, in such case, the support region 4, the first section 41 and the second section 42, firstly, in a single, shared plane. Milled into the starting, printed circuit board 16 are two trough shaped depressions 121, 122, which form fold lines 101 and 102, respectively. The trough-shaped depressions 121, 122 can, in such case, in given cases, be milled into the starting, printed circuit board 16 simultaneously with the opening 8. Because of the folding of the starting, printed circuit board 16 along the fold lines 101, 102, the regions of the printed circuit board 1 of the invention arranged perpendicularly relative to one another are obtained, i.e. the support region 4 relative to the first section 41 and, in given cases, the support region 4 relative to the second section 42. In such case, fold directions for the foldings are indicated with the arrows.

FIG. 3b is a plan view of an embodiment similar to that of FIG. 3a, wherein here a more detailed representation of the starting, printed circuit board 16 is shown. Especially, the starting, printed circuit board 16 is processed in such a manner that it is arrangeable into the housing 15 (see FIGS. 6a and 6b). The plan view of FIG. 3b shows, in such case, the bottom, or second, side 402 of the support region 4, on which contact areas for components to be soldered thereon are indicated. Shown at the same time are plan views of the trough-shaped depressions 121,122, which are also shown in detail in the sectional views of FIGS. 4a and 4b.

In a first embodiment shown in FIG. 4a, fold line 101 has a trough-shaped depression 121 with an essentially V-shaped profile. In the invention, there are no limitations concerning which side of the starting, printed circuit board 16 the trough shaped depression 121, 122 of the fold line 101,102 is arranged. Therefore, the folding of the printed circuit board is, as shown in FIG. 4*a* based on the arrows, possible in both directions, i.e. in a direction opening the trough shaped depression 121 or in a direction closing the trough shaped depression 121. In the embodiment in FIG. 4*a*, the trough shaped depression 121 has an essentially V-shaped profile, here with an aperture angle of about 120°. In contrast, an alternative embodiment in FIG. 4*b* of the profile of the trough-shaped depression 122 is essentially U-shaped and arranged on the oppositely lying side of the starting, printed circuit board; of course, the profile of the trough-shaped depression 122 can also be rectangularly shaped.

Since the conductive traces 31,32 (here not shown) transverse the fold lines 101,102, it needs to be assured that in the case of the one time folding of the starting, printed circuit board 16, the conductive traces are not damaged. This can be achieved by a layer-like construction of the starting, printed circuit board 16, in which a reinforcement with copper structures having a wall thickness of some 100 micrometers is incorporated (here not shown). This is, for example, the case for the "WIRELAID" product and, in given cases, semi-flexible starting, printed circuit boards 16 specially prepared for the invention.

Alternatively, it is possible, such as shown in FIG. 5, to use a starting, printed circuit board with different rigid and planar sections, which are connected with one another via a flexible printed circuit board region 14. Such a rigid-flexible, starting, printed circuit board 16 permits essentially any arrangement of the rigid and planar sections. Thus, for example, the support region 4 can be formed by a first rigid section of the rigid-flexible printed circuit board and the perpendiculary thereto to be arranged first section 41 by a second rigid section connected therewith via the flexible printed circuit board region 14. Of course, also combinations of the examples of embodiments illustrated in FIGS. 3*a, b*, 4 and 5 are possible, in that, for example, the first section 41 and its perpendicular arrangement relative to the support region 4 as shown in FIGS. 3*a, b* and FIG. 4 is used, and the second section 42 and its perpendicular arrangement relative to the support region 4 as shown in FIG. 5 is used.

Figure 6A:
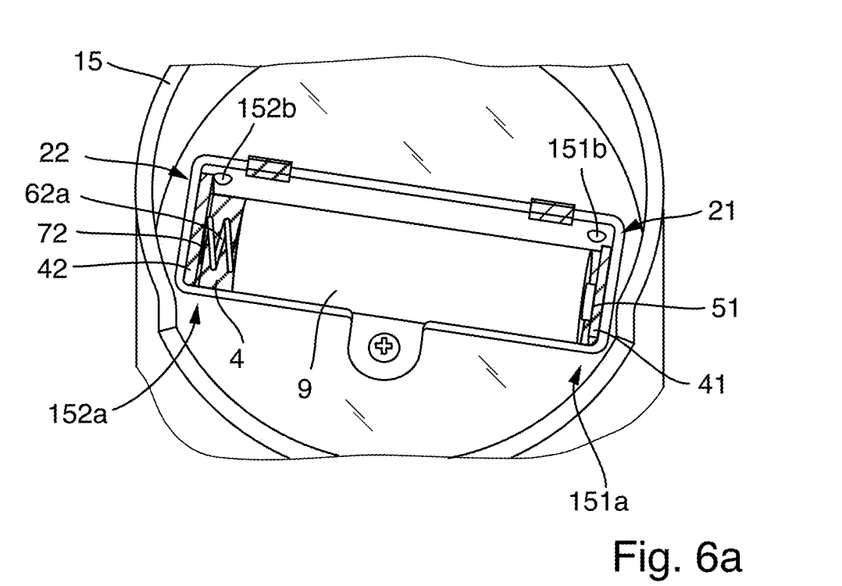
FIG. 6a shows a perspective view of an example of an embodiment of the housing and a printed circuit board of the present disclosure arranged therein.
Figure 6B:
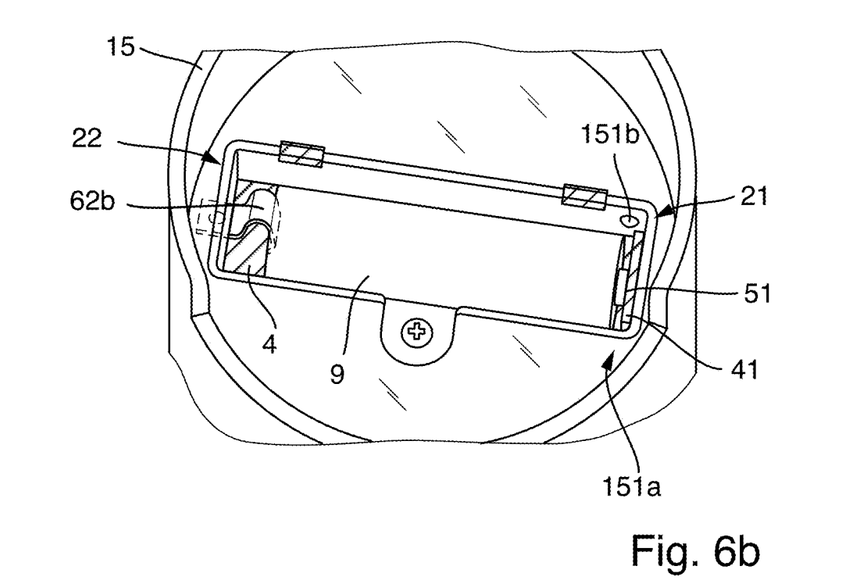
FIG. 6b shows a perspective view of an additional example of an embodiment of the housing and a printed circuit board of the present disclosure arranged therein.

FIGS. 6*a* and 6*b* are perspective views of examples of embodiments of a housing 15 with, in each case, a printed circuit board 1 of the invention arranged therein, and, in each case, a battery 9 installed in the holder 2 of the printed circuit board 1. Housing 15 is a housing 15 of a field device of automation technology.

FIG. 6*a*, in such case, shows a printed circuit board 1 arranged in the housing 15 and embodied similarly to the printed circuit board 1 shown in FIGS. 2*a, b*. In contrast with the embodiment shown in FIGS. 2*a* and 2*b*, in this variant of the invention, no locking means 13, 14 is provided on the printed circuit board 1. Instead of that, the first section 41 and the second section 42 of the printed circuit board 1 are supported in their orientation essentially perpendicular to the support region 4 by means of the housing 15. In such case, for each of the sections 41, 42, in each case, arranged essentially perpendicularly to the support region 4, a housing region 151*a*, 152*a* supporting the section 41, 42 is provided in each case. The supporting housing regions 151*a*, 152*a* include, in such case, in each case, also a seat 151*b*, 152*b*, into which the sections 41, 42, in each case, protrude. The seat 151*b*, 152*b* includes, for example, such as shown here support, an elevation holding the section 41, 42, wherein the elevation is sectionally a solid sphere. Other embodiments of the seat 151*b*, 152*b* are, of course, possible.

FIG. 6*b* represents another example of an embodiment of a housing 15 having a printed circuit board 1 of the invention arranged therein with a battery 9 installed in the holder 2, wherein the printed circuit board 1 is embodied in such case similarly to the printed circuit board 1 shown in FIGS. 1*a, b*. In this example of an embodiment, the printed circuit board 1 includes, arranged essentially perpendicularly to the support region 4, only one section 41, whose orientation is supported by the housing region 151*a*. In contrast with the printed circuit board 1 shown in FIGS. 1*a, b*, this means that here no locking means 13 mounted on the printed circuit board is necessary for the first section 41.

Figure 2C:
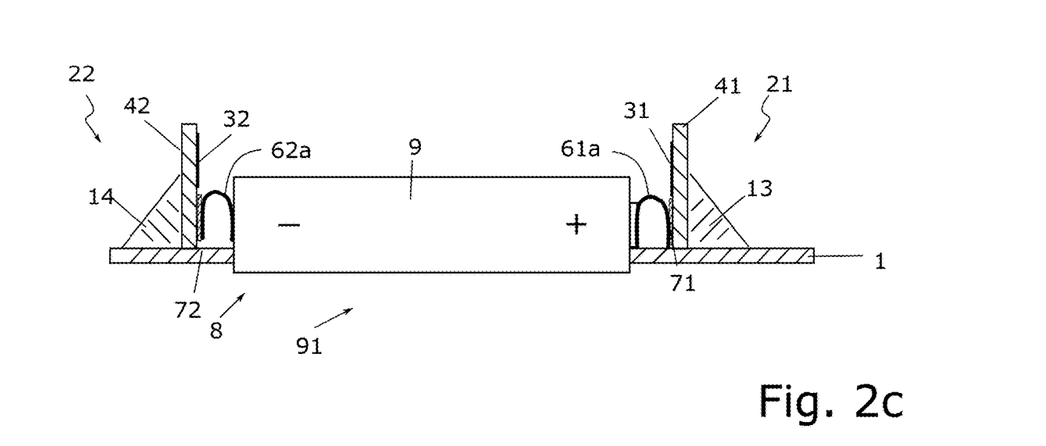
FIG. 2c shows a sectional view of an additional example of an embodiment of the printed circuit board of the present disclosure with a battery installed in the holder.

Of course, alternatively, another embodiment of the printed circuit board 1 of the invention can be arranged in the housing 15, such as, for example, the embodiment of the printed circuit board 1 of the invention shown in FIG. 2*c*, similarly to the arrangement shown in FIG. 6*a*.

The invention claimed is:

1. A printed circuit board, comprising:
   a rigid support region having an opening;
   a rigid first section bordering the support region and connected with the support region, wherein the first section is arranged perpendicularly to the support region, and wherein between the first section and the support region is a first trough-shaped depression forming a first fold line;
   a first electrical contact disposed on the first section;
   a first conductive trace extending from the first electrical contact;
   a rigid second section bordering the support region and connected with the support region, wherein the second section is arranged perpendicularly to the support region, and wherein between the second section and the support region is a second trough-shaped depression forming a second fold line;
   a second electrical contact disposed on the second section; and
   a second conductive trace extending from the second electrical contact,
   wherein the support region, the first section, and the second section form a holder for a battery, wherein the opening is dimensioned such that a portion of the battery installed from a first side of the support region into the opening and bearing on the opening protrudes out from the support region on a second side of the support region lying opposite the first side, wherein the holder is embodied such that the battery installed into the holder is clamped in an installed state between the first electrical contact and the second electrical contact such that poles of the battery on opposite end faces of the battery make electrically conductive contact with the respective first and second electrical contacts and the battery lies clamped between the first electrical contact and the second electrical contact on the support region of the printed circuit board supporting the battery and is oriented with reference to the printed circuit board such that an imaginary line connecting the poles is parallel with the support region of the printed circuit board.

2. The printed circuit board as claimed in claim 1,
   wherein the first contact includes a contact area arranged on the first section, and
   wherein the contact area serves for electrical connection with one of the poles of a battery inserted into the holder in the installed state, such that in the installed state the pole is in direct electrical connection with the contact area.

3. The printed circuit board as claimed in claim 1,
   wherein the second contact includes a resilient contact element or a contact element having a resilient section, wherein the second contact element serves for clamping and electrical connection.

4. The printed circuit board as claimed in claim 3, wherein the contact element is embodied as an SMD-solderable component that is soldered on a contact area on the printed circuit board, and
wherein the contact area is connected to the second conductive trace.

5. The printed circuit board as claimed in claim 4, wherein the contact element is a contact clip arranged in the support region, and
wherein the contact clip includes a foot soldered on the contact area and resilient section serving for clamping and electrical connection.

6. The printed circuit board as claimed in claim 3, wherein the contact element is a spring contact arranged in the second section.

7. The printed circuit board as claimed in claim 1, wherein at least one component is arranged on the second side of the support region, and
wherein the opening is dimensioned such that the portion of the battery extending out from the printed circuit board has extending out from the support region a height that is less than a height of the at least one component which has the greatest structural height.

8. The printed circuit board as claimed in claim 1, further comprising:
a first locking means arranged on the printed circuit board and embodied to fix the first section perpendicularly to the support region; and
a second locking means arranged on the printed circuit board and embodied to fix the second section perpendicularly to the support region.

9. A housing of a field device of automation technology, comprising:
a printed circuit board, including:
a rigid support region having an opening;
a rigid first section bordering the support region and connected with the support region, wherein the first section is arranged perpendicularly to the support region, and wherein between the first section and the support region is a first trough-shaped depression forming a first fold line;
a first electrical contact disposed on the first section;
a first conductive trace extending from the first electrical contact;
a rigid second section bordering the support region and connected with the support region, wherein the second section is arranged perpendicularly to the support region, and wherein between the second section and the support region is a second trough-shaped depression forming a second fold line;
a second electrical contact disposed on the second section; and
a second conductive trace extending from the second electrical contact,
wherein the support region, the first section, and the second section form a holder for a battery, wherein the opening is dimensioned such that a portion of the battery installed from a first side of the support region into the opening and bearing on the opening protrudes out from the support region on a second side of the support region lying opposite the first side, wherein the holder is embodied such that the battery installed into the holder is clamped in the installed state between the first electrical contact and the second electrical contact such that poles of the battery on opposite end faces of the battery make electrically conductive contact with the respective first and second electrical contacts and the battery lies clamped between the first electrical contact and the second electrical contact on the support region of the printed circuit board supporting the battery and is oriented with reference to the printed circuit board such that an imaginary line connecting the poles is parallel with the support region of the printed circuit board;
a first housing region for the first section of the printed circuit board; and
a second housing region for the second section of the printed circuit board,
wherein the printed circuit board is arranged in the housing such that the first housing region mechanically supports the first section of the printed circuit board by means of a seat and fixes the orientation of the first section of the printed circuit board perpendicularly to the support region of the printed circuit board, wherein the first section protrudes into the seat of the first housing region, and
wherein the printed circuit board is arranged in the housing such that the second housing region mechanically supports the second section of the printed circuit board by means of a seat and fixes the orientation of the second section of the printed circuit board perpendicularly to the support region of the printed circuit board, wherein the second section protrudes into the seat of the second housing region.

* * * * *